United States Patent
Wood (10) Patent No.: US 7,439,777 B2
(45) Date of Patent: Oct. 21, 2008

(54) DOUBLE FEEDBACK ROTARY TRAVELING WAVE OSCILLATOR DRIVEN SAMPLER CIRCUITS

(75) Inventor: John Wood, Santa Cruz, CA (US)

(73) Assignee: Multigig Inc., Scotts Valley, CA (US)

( * ) Notice: Subject to any disclaimer, the term of this patent is extended or adjusted under 35 U.S.C. 154(b) by 32 days.

(21) Appl. No.: 11/051,989

(22) Filed: Feb. 3, 2005

(65) Prior Publication Data

US 2006/0022720 A1     Feb. 2, 2006

(51) Int. Cl.
G11C 27/02  (2006.01)
H03K 5/00   (2006.01)
H03K 17/00  (2006.01)

(52) U.S. Cl. ......................................... 327/94; 327/337

(58) Field of Classification Search ............ 327/91, 327/94, 337
See application file for complete search history.

(56) References Cited

U.S. PATENT DOCUMENTS

| | | | |
|---|---|---|---|
| 4,308,468 A | 12/1981 | Olson | |
| 4,361,769 A | 11/1982 | Hatchett et al. | |
| 4,393,318 A | 7/1983 | Takahashi et al. | |
| 4,570,080 A | 2/1986 | Swanson | |
| 4,585,956 A | 4/1986 | Lie | |
| 4,617,521 A | 10/1986 | Fox | |
| 4,639,619 A | 1/1987 | Baldwin et al. | |
| 4,651,034 A | 3/1987 | Sato | |
| 4,659,945 A | 4/1987 | Metz | |
| 4,688,158 A | 8/1987 | Peterson et al. | |
| 4,728,811 A | 3/1988 | Iida et al. | |
| 4,885,545 A | 12/1989 | Sanielevici | |
| 5,004,935 A | 4/1991 | Murayama et al. | |
| 5,350,952 A | 9/1994 | Cheng et al. | |
| 5,410,269 A | 4/1995 | Ohie et al. | |
| 5,534,802 A | 7/1996 | Razavi | |
| 5,703,589 A * | 12/1997 | Kalthoff et al. | 341/172 |
| 5,736,878 A | 4/1998 | McLeod | |
| 5,886,660 A | 3/1999 | Loewenstein | |
| 5,933,463 A | 8/1999 | Choi | |
| 5,977,803 A | 11/1999 | Tsugai | |
| 6,323,696 B1 | 11/2001 | Hickling et al. | |

(Continued)

OTHER PUBLICATIONS

Haideh Khorramabadi, "EE247 Lecture 17: Digital Converters," UCB, Department of Electrical Engineering and Computer Sciences, 2004, http://www~inst.eecs.berkeley.edu/~ee247/fa04/lectures/L17_f04.pdf#search='EECS%20247%20Lecture%2017%3A%20Data%20Converters'.

Primary Examiner—Quan Tra (57) ABSTRACT

A sampling circuit and method are disclosed. The sampling circuit includes a buffer, a holding capacitor, a set of switches, and at least two voltage references. The buffer drives buffered analog input signal via a first switch to a first node of holding capacitor. A second switch connects a second node of the holding capacitor to a first reference voltage. A third switch connects the second node of the holding capacitor to a second reference voltage. When the first and second switches are closed, charge accumulates on the holding capacitor. Opening the second switch terminates charging. The third switch biases the charged capacitor to the second reference voltage and the sampled output is taken from the first node of the holding capacitor. A rotary clock and control circuit provide the precise timing for the switches, especially the opening of the second switch, which determines the end of the sampling time.

15 Claims, 11 Drawing Sheets

U.S. PATENT DOCUMENTS

| | | | |
|---|---|---|---|
| 6,404,262 B1 * | 6/2002 | Nagaraj et al. | 327/336 |
| 6,556,089 B2 * | 4/2003 | Wood | 331/57 |
| 6,707,411 B1 | 3/2004 | Poulton et al. | |
| 7,015,850 B2 * | 3/2006 | Ayyagari et al. | 341/155 |

* cited by examiner

DOUBLE FEEDBACK ROTARY TRAVELING WAVE OSCILLATOR DRIVEN SAMPLER CIRCUITS

CROSS-REFERENCE TO RELATED APPLICATIONS

This application incorporates by reference U.S. Pat. No. 6,556,089.

This application claims priority to and incorporates by reference Great Britain Application GB0416803 AO, titled "ROTARY FLASH ADC, filed on Jul. 27, 2004, in Great Britain.

FIELD OF THE INVENTION

The present invention relates generally to analog to digital converters and more particularly to the sample and hold circuitry used therein.

DESCRIPTION OF THE RELATED ART

Figure 1:
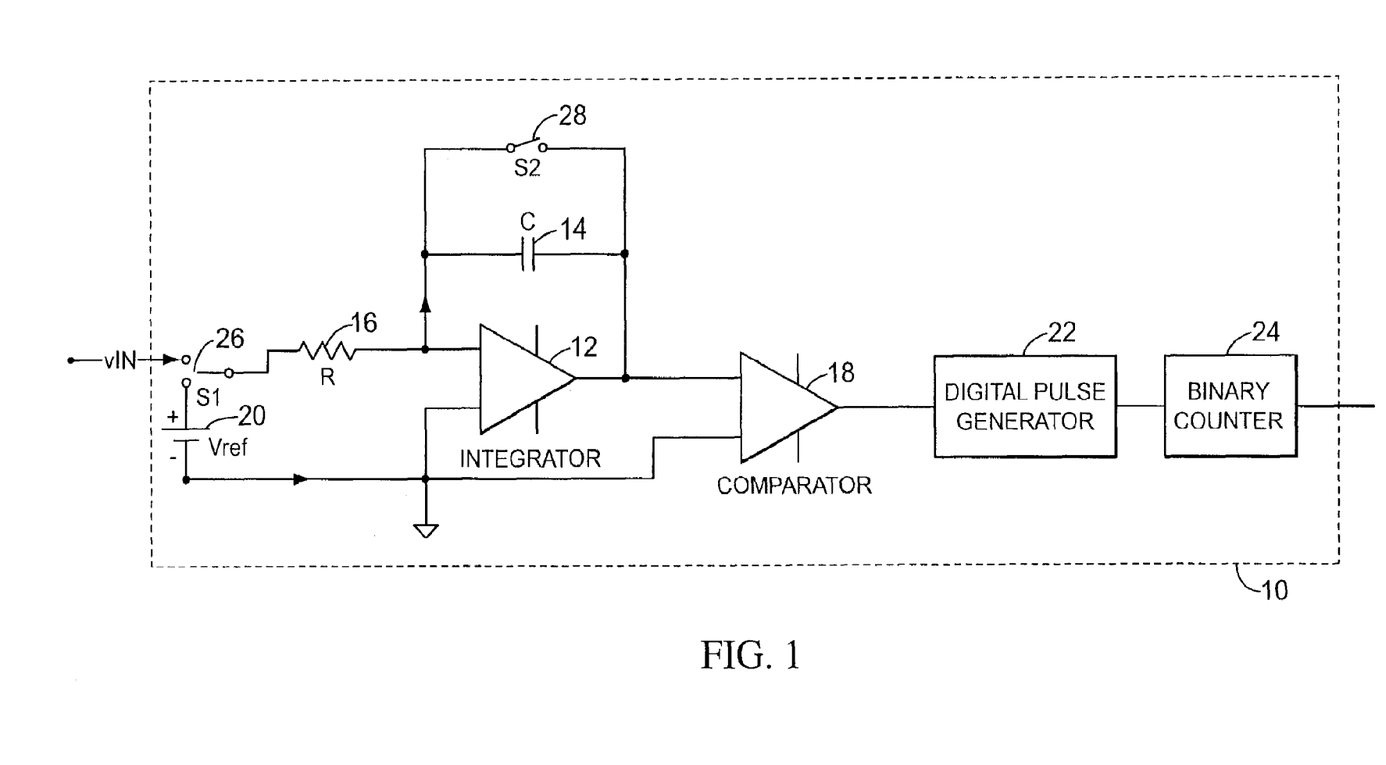
FIG. 1 shows a conventional analog-to-digital converter.

In analog to digital conversion (ADC) systems, when a conversion is performed, an analog signal must be sampled at an instant in time and then held while a digital equivalent of the signal is computed. FIG. 1 shows a convention dual-slope A/D conversion system, which includes an integrator 12, with integration capacitor 14 and integration resistor 16, comparator 18, voltage reference, digital pulse generator 22 and binary counter 24. Also included are switches S1 26 and S2 28 for controlling the various phases of measurement. In such a system, the analog signal vIN must be held stable during a precise time interval in which the first phase of an integration occurs. During the second phase, an integration of a stable reference occurs. The time to integrate the stable reference back to a known condition is measured digitally and is proportional to the sampled input signal. Key to this system is the quality of the sample and hold circuitry.

Figure 2:
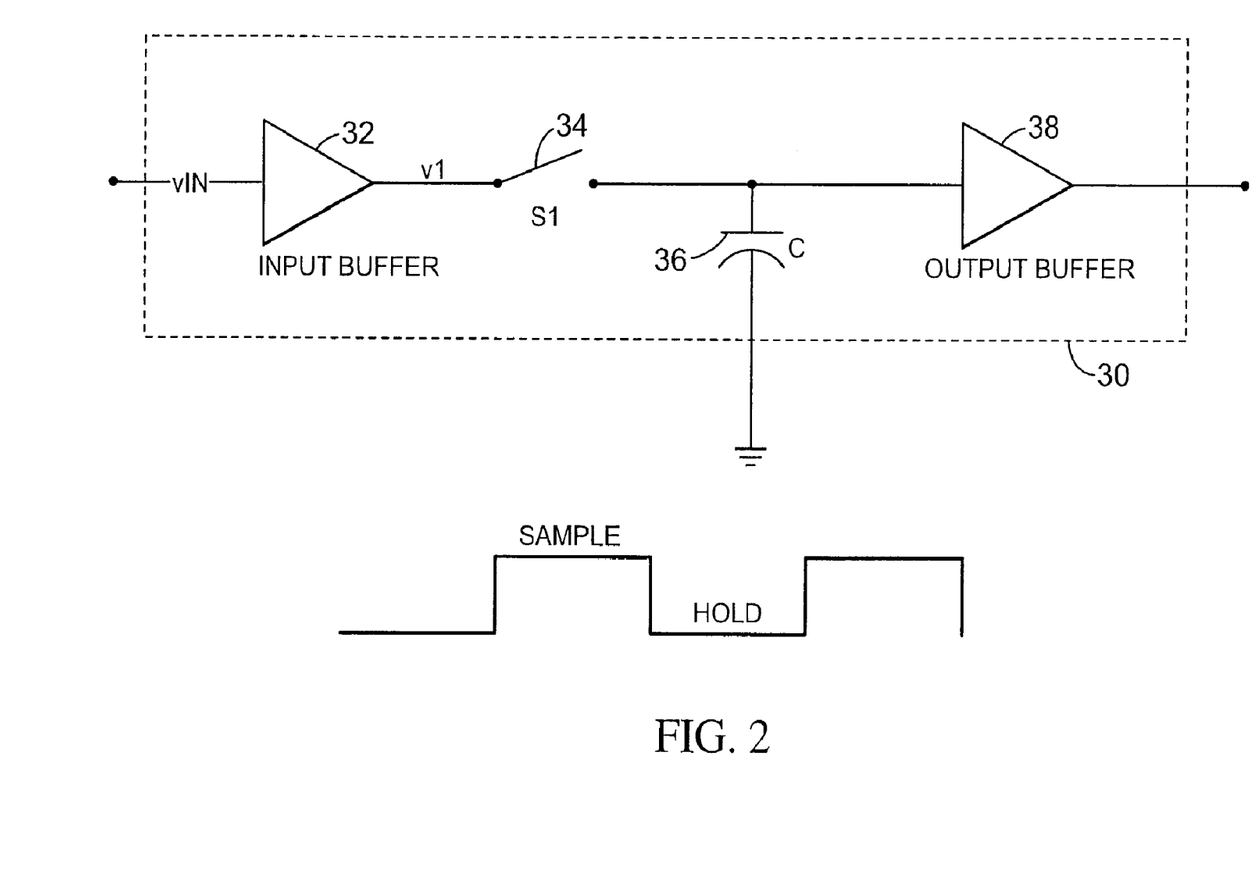
FIG. 2 shows the conventional approach to sampling.

Conventional sample and hold circuits, such as the one shown in FIG. 2, usually include an input buffer stage 32, an input transmission gate S1 34, a holding capacitor C 36, and an output buffer stage 38. The input buffer 32 replicates the analog input signal while minimizing the load on the analog signal. The input buffer 32 also provides the current to charge the holding capacitor 36. The output buffer 38 replicates the capacitor voltage when the transmission gate 34 is open. It also common for sample and hold circuits to have a buffer chain in the path of the signal that controls the transmission gate, which is typically a MOS transistor.

Existing sample and hold circuits have a problem with precision due to aperture jitter. Aperture jitter (cycle-to-cycle) occurs when the sampling window moves with respect to the input waveform. This is an especially difficult problem when the input waveform is a high slew rate signal. Sampling a little earlier gives one voltage and sampling a little later gives a different voltage. The time uncertainty of the sampling window translates to uncertainty in the digital word used to represent the sampled quantity. The higher the frequency of the input voltage, the greater the potential error. In addition to the time uncertainty of the sampling window, inaccurate timing for defining the window means that part of the sampling interval is used up, thereby slowing the circuitry down.

Another problem with the existing art is signal feedthough from the analog input due to parasitic capacitances of the MOSFET device.

As a result of the above deficiencies current sample and hold circuits typically have a 400 femtosecond (fs) to 500 fs rating for the jitter of the sampling window.

Prior art has attempted to deal with these deficiencies by minimizing the delay of the buffer chain (a main source of jitter), driving the MOSFET pass transistor with a high amount of current and by driving the gate of the MOSFET pass transistor with a high slew rate signal.

One particular solution uses a resonant circuit whose output has a large amplitude sine wave buffered with a single stage that drives the sampling switch. The high amplitude is helpful in reducing the jitter of sampling window because of its high slew rate (high dV/dt). A deficiency of this approach is that the high voltage output may be greater than the supply voltage, Vdd, creating problems with the operation of the sampling switch when implemented as a MOSFET device. Furthermore, the resonant circuit frequency of the resonant circuit is "pulled" (altered) by the capacitances of the sampling circuit, making the exact resonant frequency a function of the circuitry.

Also, because of the presence of parasitic capacitances on the MOSFET, such as the gate capacitances, (gate-to-drain $c_{GD}$, gate-to-source $c_{GS}$), which are a function of the voltages on the device, analog input voltages modulate the waveform used to control (open and close) the switch and therefore affect the sampling period. This error is not the same as jitter, because it is proportional to the input signal.

There is a need for a more precise sample and hold circuit, one that can avoid sampling errors even with very fast analog input signals.

BRIEF SUMMARY OF THE INVENTION

The present invention is directed to the above need. The invention is a completely new solution using rotary clocks which provide a plurality of clocks having any desired phase relationship. Rotary clock cycle-to-cycle jitter is very low, in the 10 fs range.

One embodiment of the present invention is a sampling circuit, which includes a buffer, a holding capacitor, three switches, a multi-phase oscillator, and a control circuit. The buffer has an input for receiving an input signal to be sampled, and drives at its output a buffered version of the input signal. The holding capacitor is configured to hold between its first and second nodes a voltage representative of a sampled, buffered input signal. The first switch is connected between the buffer output and the first node of the holding capacitor, where the first node of the holding capacitor is configured to provide the sampled output voltage. The second switch is connected between the second node of the holding capacitor and a first reference voltage. The third switch is connected between the second node of the holding capacitor and a second reference voltage. The multi-phase oscillator is configured to provide one or more clock signals, one of which operates the second switch. The control circuit receives the one or more rotary clock signals and provides timing pulses for opening and closing the first switch and third switches. The first switch and second switch are closed during sampling of the input signal and the second switch is opened to end the sampling. After the second switch is opened, the control circuit closes the third switch to bias the voltage on the charging capacitor with the second reference voltage.

Another embodiment of the present invention is a method for sampling an input signal. The method includes connecting a first node of a holding capacitor to a first reference voltage by means of a first switch, connecting a second node of a holding capacitor to the analog signal by means of a second switch, and accumulating charge on a second node of the holding capacitor during a prescribed interval of time while the analog signal is connected to the holding capacitor. The first node of the holding capacitor is then disconnected from the first reference voltage to end the accumulation of charge and the second node of the holding capacitor is disconnected from the analog signal. The first node of the holding capacitor is then connected to a second reference voltage by means of a third switch, and the sampled analog signal is available on the second node of the holding capacitor.

One advantage of the present invention is that precise timing control of the switches is possible via the many phases that are available from the rotary traveling wave clock. This precise timing control allows the sampling window to be a precise value.

Yet another advantage of the present invention is that there is minimal effect on the rotary clock due to the arrangement of the holding capacitor and the second switch. This helps to preserve the favorable characteristics, including low jitter, of the rotary clock for the circuit.

Yet another advantage of the present invention is that the second switch can be a large semiconductor device when the auxiliary switch is used, because the second switch changes state with practically no voltage across it.

Yet another advantage is that an A to D circuit can be built with more bits of precision because of the low noise and precise timing characteristics of the rotary traveling wave clock.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 3:
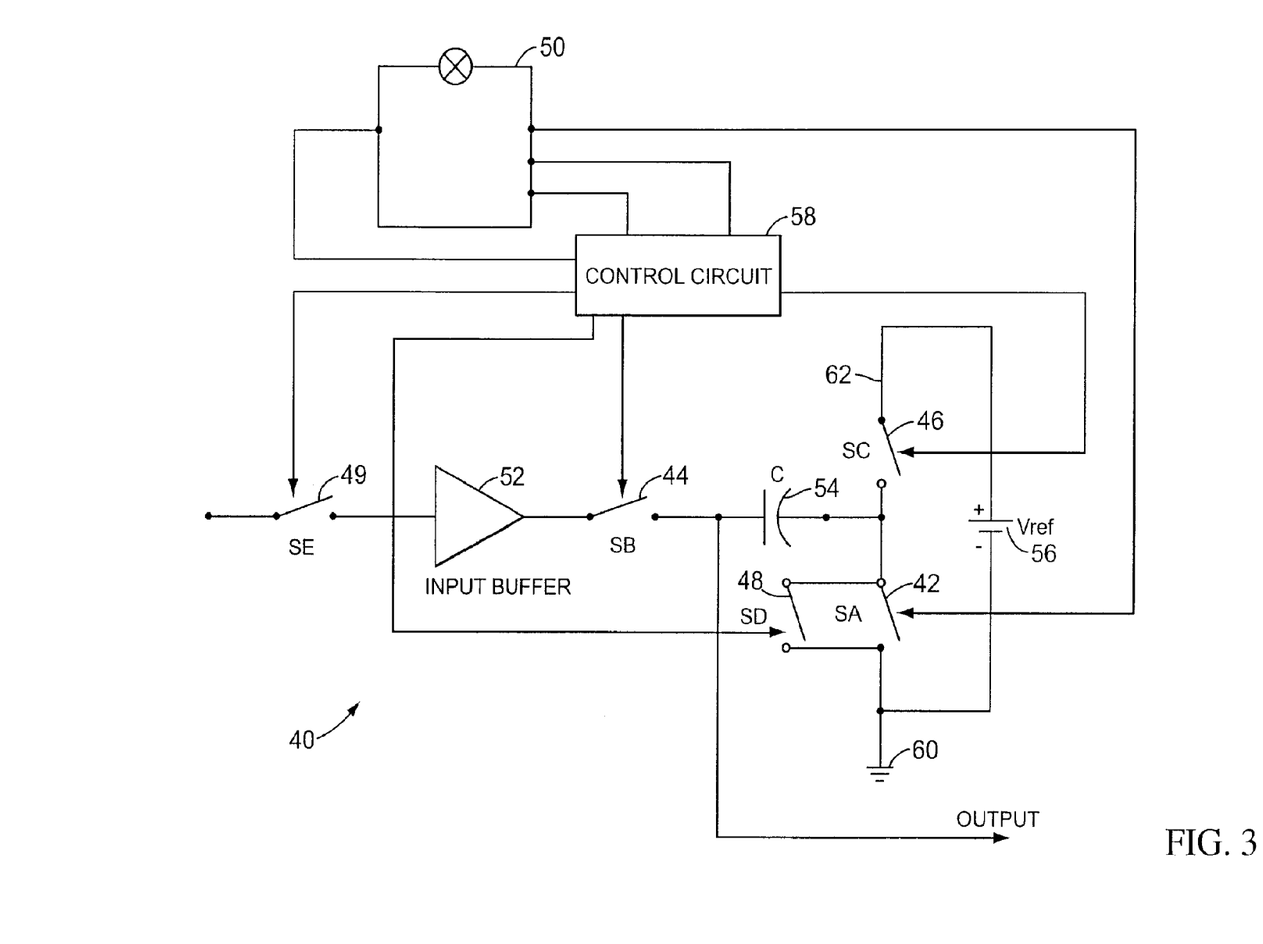
FIG. 3 shows an embodiment of the present invention.

FIG. 3 shows an embodiment 40 of the present invention. The sampling system 40 includes switches SA 42, SB 44, SC 46, SD 48 and SE 49, a rotary clock oscillator 50 (described in U.S. Pat. No. 6,556,089), an input buffer 52, a sampling capacitor 54, a voltage reference 56, and control circuitry 58.

Switch SE 49 connects the input analog voltage to the input buffer 52. Switch SB 44 connects the output of the input buffer 52 to a first node of the charging capacitor C 54. Switch SA 42 connects a second node of the charging capacitor 54 to a ground reference node 60. Switch SC 46 connects the second node of the charging capacitor 54 to a voltage reference node 62. Switch SD 48 is connected in parallel with switch SA 42, and is discussed below. The voltage reference Vref 56 can be any voltage, including the ground potential. The rotary clock oscillator 50 and control circuit 58 provide the clock taps and timing controls for the various switches.

Operation

Figure 4:
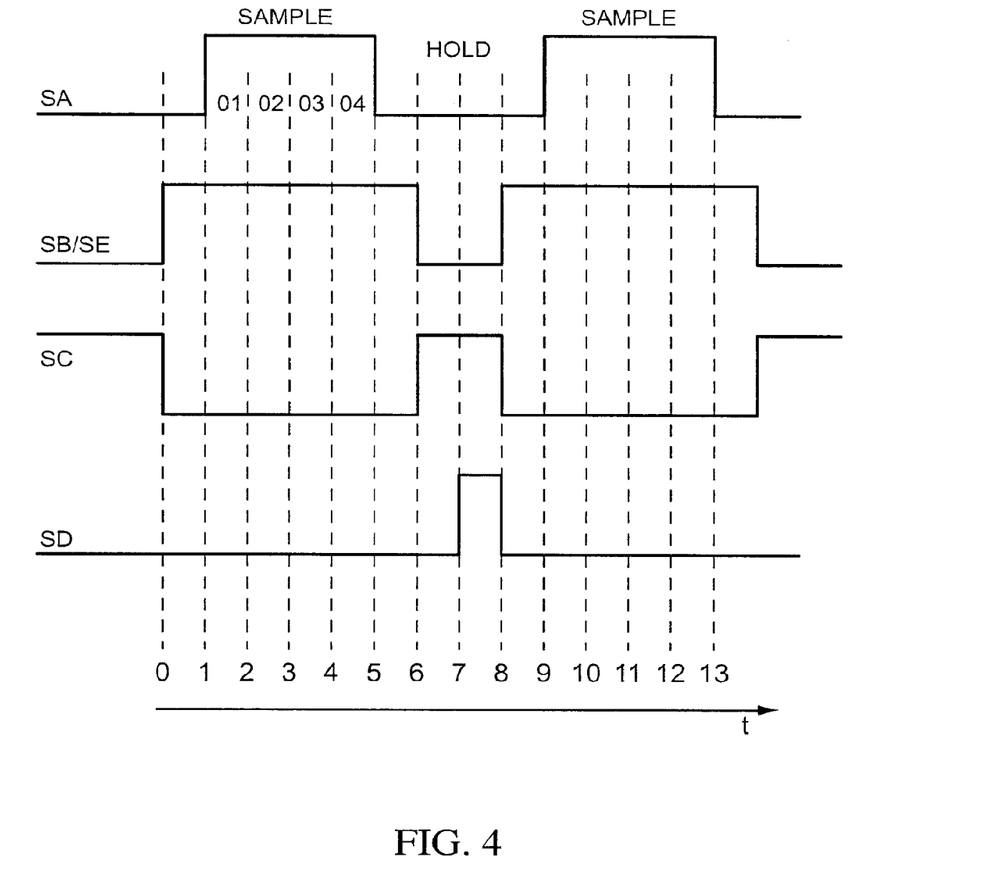
FIG. 4 shows a timing diagram for controlling the sampling circuit of the present invention.

Referring to FIG. 4, which shows the sampling interval divided into four phases, $\Phi1$, $\Phi2$, $\Phi3$, $\Phi4$ sampling occurs during a interval $t1 \leq t \leq t5$ of the rotary clock. Prior to the start t1 of the sampling interval, switches SA 42, SC 46 and SD 48 are open and SB 44 and SE 49 are closed. When switches SA 42, SB 44 and SE 49 are closed at t1, sampling starts and charge accumulates on capacitor C 54. Sampling is completed at t5 when switch SA 42 opens, disconnecting the charging capacitor 54 from ground node 60 and thus preventing the accumulation of more charge on capacitor C 54. A short time later at t6, switch SB 44 opens, isolating the charging capacitor 54, which now floats for an instant. No charge injection occurs when switch SB 44 opens. At the same or nearly the same time t6, switch SC 46 closes, causing both sides of the charging capacitor 54 to increase by a voltage equal to Vref. During interval $t7 \leq t \leq t8$, switch SD 48, described in more detail below, pre-discharges any charge on switch SA 42. Of course, other timing schemes are possible and timing can be improved with more timing phases of the rotary clock 50.

Figure 5:
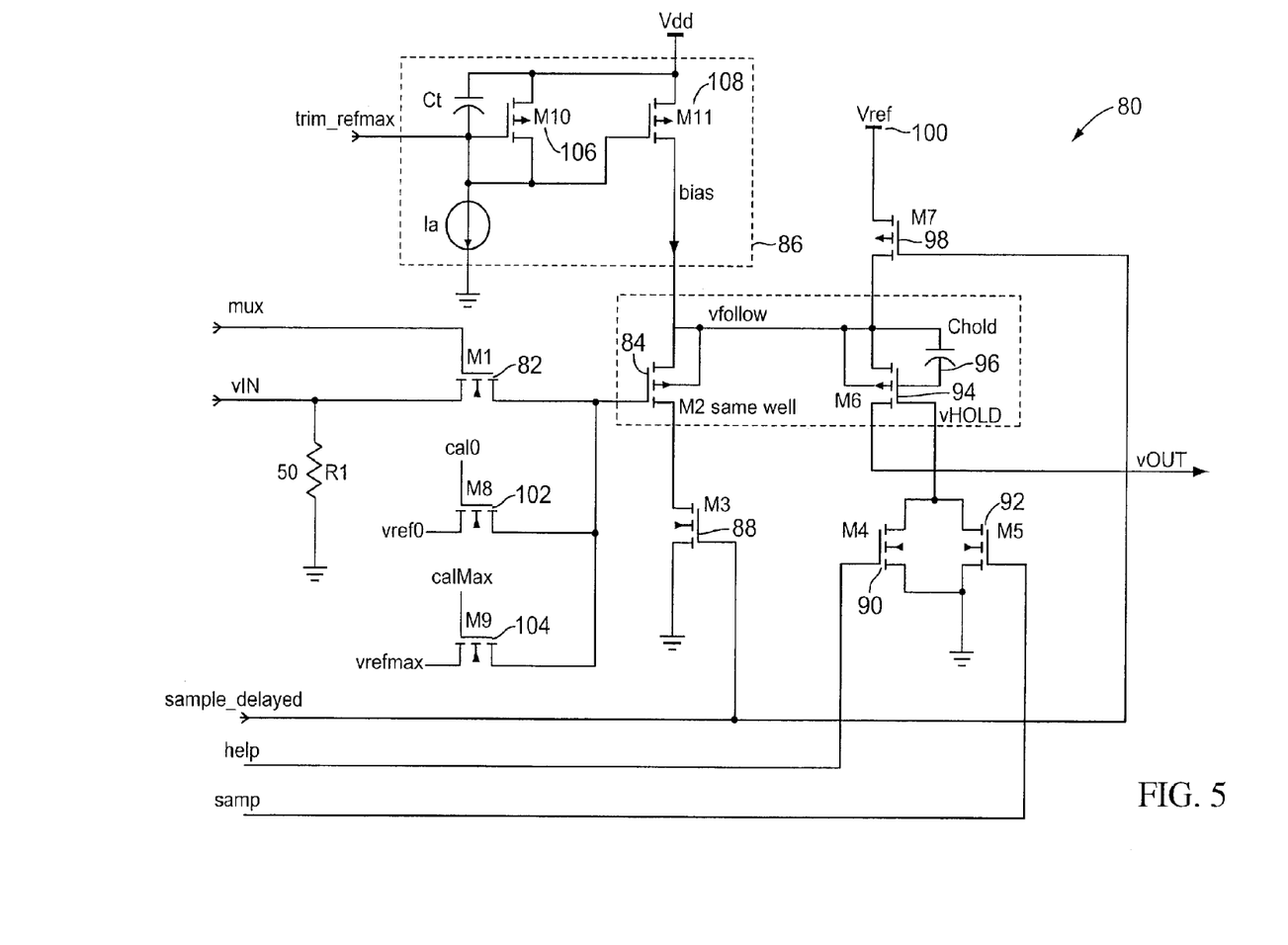
FIG. 5 shows an embodiment of the present invention using MOS transistors.

FIG. 5 shows an embodiment of the present invention using MOS transistors. Transistor M1 82 connects between the analog input vIN, and the gate of transistor M2 84. The gate of transistor M1 82 connects to the mux signal. Transistor M2 82 is connected between a current source 86 (at its source) and the drain of transistor M3 88, whose source is connected to ground. Transistors M4 90 and M5 92 are connected in parallel with their drains connected to the gate of transistor M6 94 and their sources connected to ground. The gate of transistor M6 94 is the storage node 96 for the sampled voltage, vHOLD. The gate of M5 92 is connected to the samp signal and the gate of M4 90 is connected to the help signal. The source (output) of transistor M2 84 is connected to the source of transistor M6 94, whose capacitance acts as the holding capacitor Chold. The drain of transistor M6 96 is the circuit output. Transistor M7 98 connects the source of M6 94 to a reference voltage Vref 100. The gate of transistor M7 98 is connected to the sample_delayed signal. Transistors M8 102 and M9 104 are used in a calibration circuit. Transistors M10 106 and M11 108 comprise a current mirror to supply current to the transistor M2 84.

Figure 6:
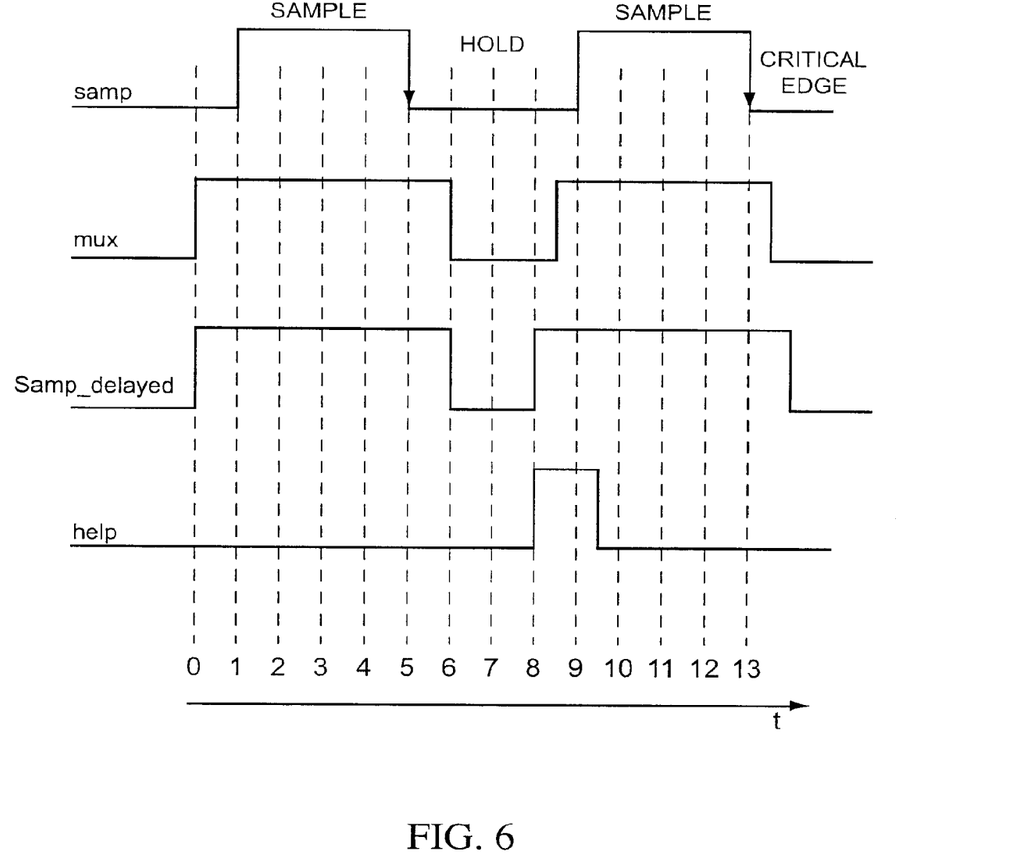
FIG. 6 shows a timing diagram for the circuitry of figure 5.

FIG. 6 shows selected timing signals for controlling the circuitry of FIG. 5. The signal sample_delayed in FIG. 5 (Samp_delayed in FIG. 6) is turned on first, at t0, to turn on the buffer (source follower) transistor M2 84 by providing a path to ground for the current source from the current mirror M10/M11 86. At t0, the mux signal is also asserted, which causes the input switch M1 82 to connect the input signal vIN to the gate of the buffer transistor M2 84. Following this, the samp signal is asserted, at t1, causing the M5 92 transistor to conduct. This provides a ground reference for one node of the holding capacitor (at the gate of transistor M6 94). Charge accumulation occurs while the sample signal is asserted. When the samp signal is de-asserted at t5, sampling stops and a short time later, after t6, the mux signal is de-asserted, isolating transistor M2 84 from the analog input signal vIN. Following de-assertion of the samp signal, the sample_delayed signal is de-asserted, at t6, causing the source follower 84 to be inactivated and the reference voltage 100 to bias the charge on the holding capacitor by turning on transistor M7 98. The sampled voltage is taken from the drain of the transistor M6 94.

The transistor M5 92 (the sampling transistor) operates without any significant drain to source voltage (Vds). This has the advantage of causing any turn-off charge injection to the gate of the M5 92 transistor to become a constant, thereby allowing the appropriate rotary clock signal to be directly connected to the gate. The fast edge rate and low phase noise of the rotary clock signal then controls the switching of the M5 transistor 92.

The transistor M4 90 is used, in some embodiments such as the one shown, to pre-discharge the drain of transistor M5 92 before, transistor M5 92 is turned on.

The holding capacitor Chold is the gate to channel/drain/source capacitance of the transistor M6 95. This is permissible because the MOS transistor is always operating in the enhancement region (triode region) of operation making use of this capacitance reliable.

Setting the Size of the Holding Capacitance

The relation kT/VC<LSB, which assures that the thermal noise level is less than the least significant bit (LSB) of the digital representation of the input signal, can be used to set the size of C. The size of C, referring to FIG. 3, then sets the size of the switch SA's resistance encountered during charging and this puts a limit on the W/L ratio of a MOS transistor used for switch SA. It is desirable to have the charging time equal to 10RC, where C is determined by kT/VC<LSB relation, and R=$R_{SA}$ is the resistance of switch SA. For example, if the input signal has a range of 1 volt and there is to be 16-bit digital representation of the signal, then the LSB is about 15 uV. Setting C to 100 fF, causes kT/VC to be about 0.04 uV and the relative noise level to be about 0.25% of the LSB. With an oscillator frequency of 5 GHz (⅕₀₀ pS), a convenient sampling period is about 100 pS. This means that the RC time constant should not exceed 10 pS and constrains R to be about 100 ohms or less.

Auxiliary Switch

When switch SA 42, in FIG. 3, is implemented as a MOS transistor (M5 92 in FIG. 5) some precautions need to be taken to assure the best results. It has been discovered that the rotary clock is most affected when the edges of the clock pass the input (gate) of the SA transistor. Before or after the edges of the clock pass the gate, there is little or no effect on the clock. Thus, to minimize the effect on the rotary clock when the SA switch is activated, an auxiliary switch SD 48 (M4 90 in FIG. 5), in one embodiment, is employed. The switch is turned on just ahead in time of the sampling interval, at time t7 in FIG. 4, to bleed off (pre-discharge) any charge on the second node of the capacitor C 54, so that when the SA 42 transistor is turned on, there is practically no voltage across it. This prevents the rotary clock from being disturbed because, when the edges of the clock pass the SA transistor 42, there is no voltage across the transistor and thus little or no coupling occurs from drain of the transistor back to the clock. The auxiliary switch SD 48 need only be strong enough to bleed the charge; it does not need to be so strong as to hold the full charge of the capacitor. The auxiliary switch SD 48 is conveniently controlled from a buffered tap on the rotary clock. This configuration allows the intrinsic jitter of the rotary clock to be controlling, saves power, and allows the SA transistor 42 to be larger than otherwise (because its capacitance has little or no effect on the rotary clock).

The rotary clock may be tuned to a PLL that is driven from a reference clock received from a clock input pin on chip. The PLL averages the noise of the reference clock because of its low pass filter. The PLL multiplies up the frequency to run the rotary clock and tunes the rotary clock by varactor or switched capacitor.

Known transmission-lines broadly fall into two categories in that they are either open-ended or specifically terminated either partially or fully. Transmission-lines as proposed herein are different in being neither terminated nor open-ended. They are not even unterminated as such term might be understood hitherto; and, as unterminated herein, are seen as constituting a structural aspect of invention, including by reason of affording a signal path exhibiting endless electromagnetic continuity.

Figure 7:
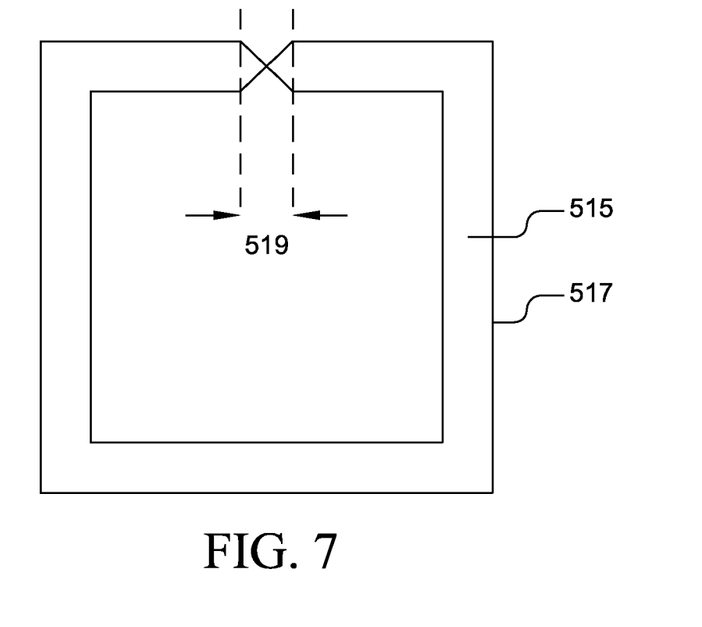
FIG. 7 is an outline diagram for a transmission-line structure hereof.
Figure 9:
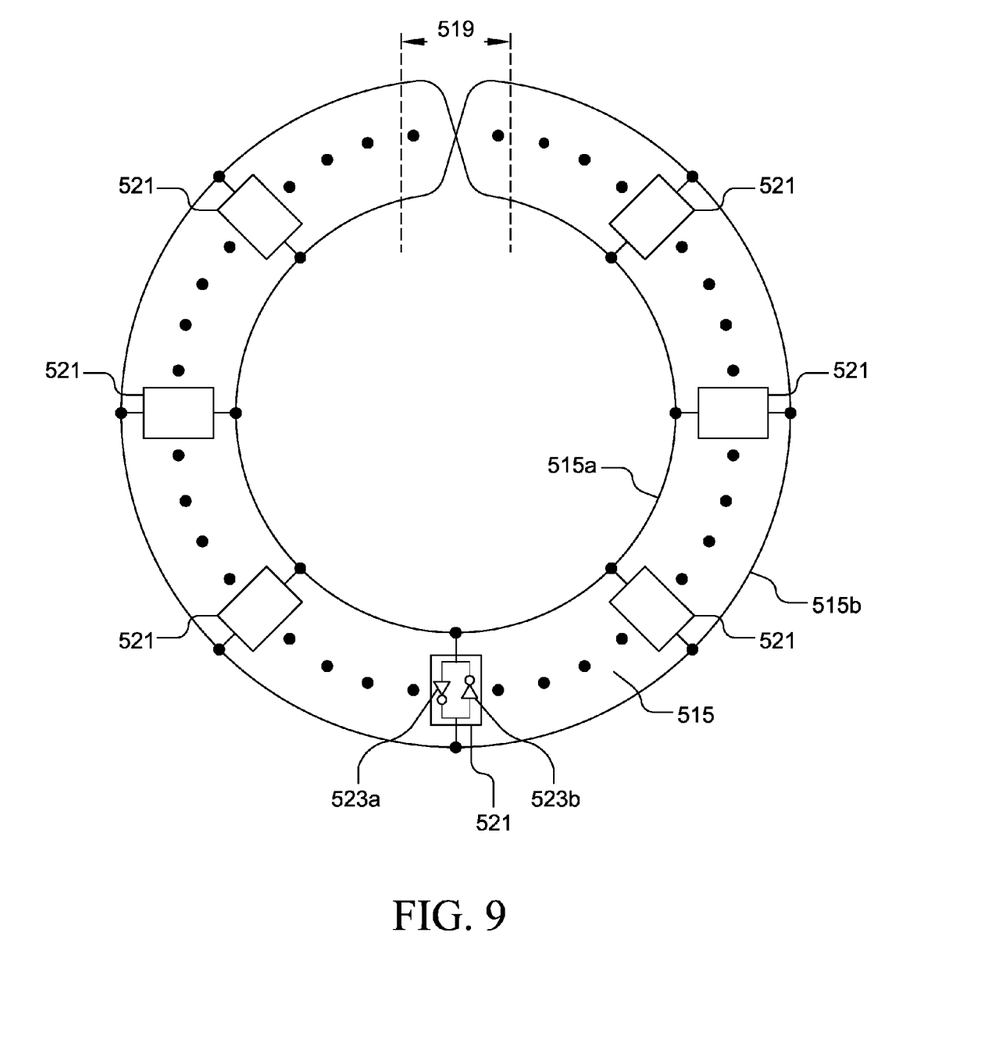
FIG. 9 is an outline circuit diagram for a traveling wave oscillator hereof.

FIG. 7 shows such a transmission-line 515 as a structure that is further seen as physically endless, specifically comprising a single continuous "originating" conductor formation 517 shown forming two appropriately spaced generally parallel traces as loops 515a, 515b in FIG. 9 with a cross-over at 519 that does not involve any local electrical connection of the conductor 517. Herein, the length of the originating conductor 517 is taken as S, and corresponds to two 'laps' of the transmission-line 515 as defined between the spaced loop traces 515a, 515b and through the cross-over 519.

Figure 8:
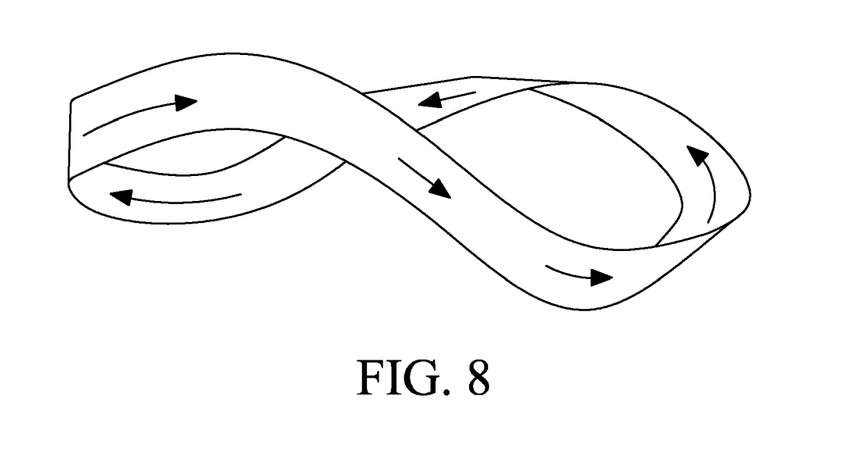
FIG. 8 shows a Moebius strip.

This structure of the transmission-line 515 has a planar equivalence to a Moebius strip, see FIG. 8, where an endless strip with a single twist through 180° has the remarkable topology of effectively converting a two-sided and two-edged, but twisted and ends-joined, originating strip to have only one side and one edge, see arrows endlessly tracking the centre line of the strip. From any position along the strip, return will be with originally left- and right-hand edges reversed, inverted or transposed. The same would be true for any odd number of such twists along the length of the strip. Such a strip of conductive material would perform as required for signal paths of embodiments of this invention, and constitutes another structural aspect of invention. A flexible substrate would allow implementing a true Mobius strip transmission-line structure, i.e. with graduality of twist that could be advantageous compared with planar equivalent cross-over 519. A flexible printed circuit board so formed and with its ICs mounted is seen as a feasible proposition.

FIG. 9 is a circuit diagram for a pulse generator, actually an oscillator, using the transmission-line 515 of FIG. 7, specifically further having plural spaced regenerative active means conveniently as bi-directional inverting switching/amplifying circuitry 521 connected between the conductive loop traces 515a, 515b. The circuitry 521 is further illustrated in this particular embodiment as comprising two inverters 523a, 523b that are connected back-to-back. Alternatives regenerative means that rely on negative resistance, negative capacitance or are otherwise suitably non-linear, and regenerative (such as Gunn diodes) or are of transmission-line nature. It is preferred that the circuitry 521 is plural and distributed along the transmission-line 515, further preferably evenly, or substantially evenly; also in large numbers say up to 100 or more, further preferably as many and each as small as reasonably practical.

Inverters 523a, 523b of each switching amplifier 521 will have the usual operative connections to relatively positive and negative supply rails, usually V+ and GND, respectively. Respective input/output terminals of each circuit 521 are shown connected to the transmission-line 515 between the loops 515a, 515b at substantially maximum spacing apart along the effectively single conductor 517, thus each at substantially halfway around the transmission-line 515 relative to the other.

Figure 10:
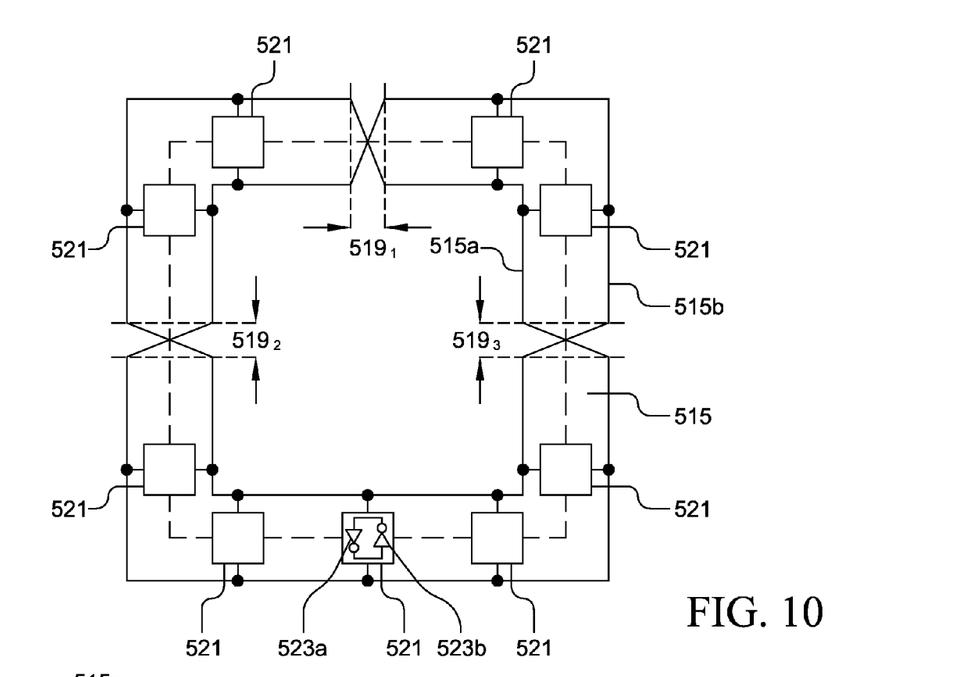
FIG. 10 is another outline circuit diagram for a traveling wave oscillator hereof.

FIG. 10 is another circuit diagram for an oscillator using a transmission-line structure hereof but with three cross-overs 519₁, 519₂, 519₃, thus the same Moebius strip-like reversing/inverting/transposing property as applies in FIG. 9. The rectangular and circular shapes shown for the transmission-line 515 are for convenience of illustration. They can be any shape, including geometrically irregular, so long as they have a length appropriate to the desired operating frequency, i.e. so that a signal leaving an amplifier 521 arrives back inverted after a ful 'lap' of the transmission-line 515, i.e. effectively the spacing between the ioops 515a,b plus the crossover 519, traversed in a time Tp effectively defining a pulse width or half-cycle oscillation time of the operating frequency.

Advantages of evenly distributing the amplifiers 521 along the transmission-line 515 are twofold. Firstly, spreading stray capacitance effectively lumped at associated amplifiers 521 for better and easier absorbing into the transmission-line characteristic impedance Zo thus reducing and signal reflection effects and improving poor waveshape definition. Secondly, the signal amplitude determined by the supply voltages V+ and GND will be more substantially constant over the entire transmission-line 515 better to compensate for losses associated with the transmission-lines dielectric and conductor materials. A continuous closed-loop transmission- line 515 with regenerative switching means 521 substantially evenly distributed and connected can closely resemble a substantially uniform structure that appears the same at any point.

A good rule is for elementary capacitance and inductance (Ce and Le) associated with each regenerative switching means and forming a resonant shunt tank LC circuit to have a resonant frequency of $1/(2\pi\sqrt{L_e C_e})$ that is greater than the self-sustaining oscillating frequency F (F3, F5 etc.) of the transmission-line 515.

Figure 11A:
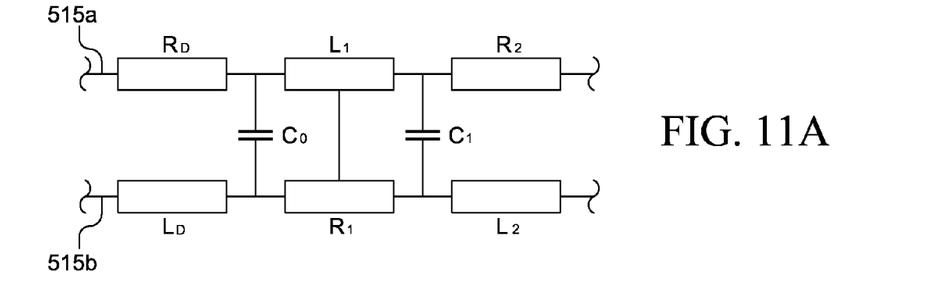
FIGS. 11a and 11b are equivalent circuits for distributed electrical models of a portion of a transmission-line hereof.

FIG. 11a is a distributed electrical equivalent circuit or model of a portion of a transmission-line 515 hereof. It shows alternate distributed resistive (R) and inductive (L) elements connected in series, i.e. $R_0$ connected in series with $L_1$ in turn connected in series with R2 and so on for a portion of loop 515a, and registering $L_0$ connected in series with $R_1$ in turn connected in series with $L_2$ and so on for the adjacent portion of loop 515b; and distributed capacitive elements $C_0$ and $C_1$ shown connected in parallel across the transmission-line 15 thus to the loops 515a and 515b between the resistive/inductive elements $R_0/L_1$ and the inductive/resistive elements $L_0/R_1$, respectively for $C_0$ and between the inductive/resistive elements $L_1/R_2$ and the resistive/inductive elements $R_1/L_2$, respectively for $C_1$: where the identities $R_0=R_1=R_2$, $L_0=L_1=L_2$ and $C_0=C_1$ substantially hold and the illustrated distributed RLC model extends over the whole length of the transmission-line 515. Although not shown, there will actually be a parasitic resistive element in parallel with each capacitive element C, specifically its dielectric material.

Figure 11B:
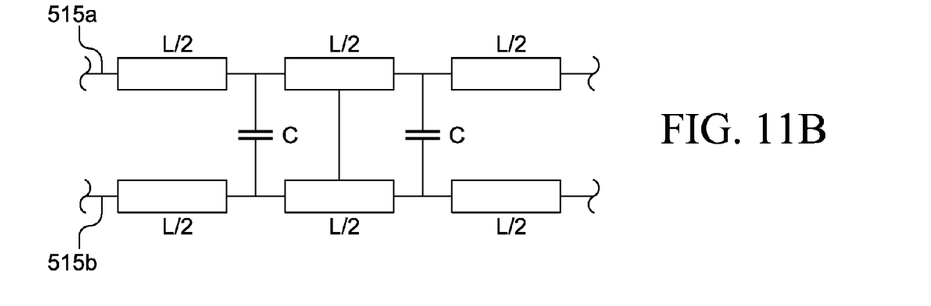

FIG. 11b is a further simplified alternative distributed electrical equivalent circuit or model that ignores resistance, see replacement of those of FIG. 11a by further distribution of inductive elements in series at half (L/2) their value (L) in FIG. 11a. This model is useful for understanding basic principles of operation of transmission-lines embodying the invention.

During a 'start-up' phase, i.e. after power is first applied to the amplifiers 521, oscillation will get initiated from amplification of inherent noise within the amplifiers 521, thus begin substantially chaotically though it will quickly settle to oscillation at a fundamental frequency F, typically within nanoseconds. For each amplifier 521, respective signals from its inverters 523a and 523b arrive back inverted after experiencing a propagation delay Tp around the transmission-line 515. This propagation delay Tp is a function of the inductive and capacitive parameters of the transmission-line 515; which, as expressed in henrys per meter (L) and in farads per meter (C) to include all capacitive loading of the transmission-line, lead to a characteristic impedance Zo=SQR (L/C) and a line traverse or propagation or phase velocity-Pv=1/SQRT(L/C). Reinforcement, i.e. selective amplification, of those frequencies for which the delay Tp is an integer sub-divisor of a half-cycle time gives rise to the dominant lowest frequency, i.e. the fundamental frequency F=1/(2•Tp), for which the sub-divisor condition is satisfied. All other integer multiples of this frequency also satisfy this sub-divisor condition, but gain of the amplifiers 521 falls off, i.e. decreases, for higher frequencies, so the transmission-line 515 will quickly settle to fundamental oscillation at the frequency F.

The transmission-line 515 has endless electromagnetic continuity, which, along with fast switching times of preferred transistors in the inverters 523a and 523b, leads to a strongly square wave-form containing odd harmonics of the fundamental frequency F in effectively reinforced oscillation. At the fundamental oscillating frequency F, including the odd harmonic frequencies, the terminals of the amplifiers 521 appear substantially unloaded, due to the transmission-line 515 being 'closed-loop' without any form of termination, which results very desirably in low power dissipation and low drive requirements. The inductance and capacitance per unit length of the transmission-line 515 can be altered independently, as can also be desirable and advantageous.

Figure 12:
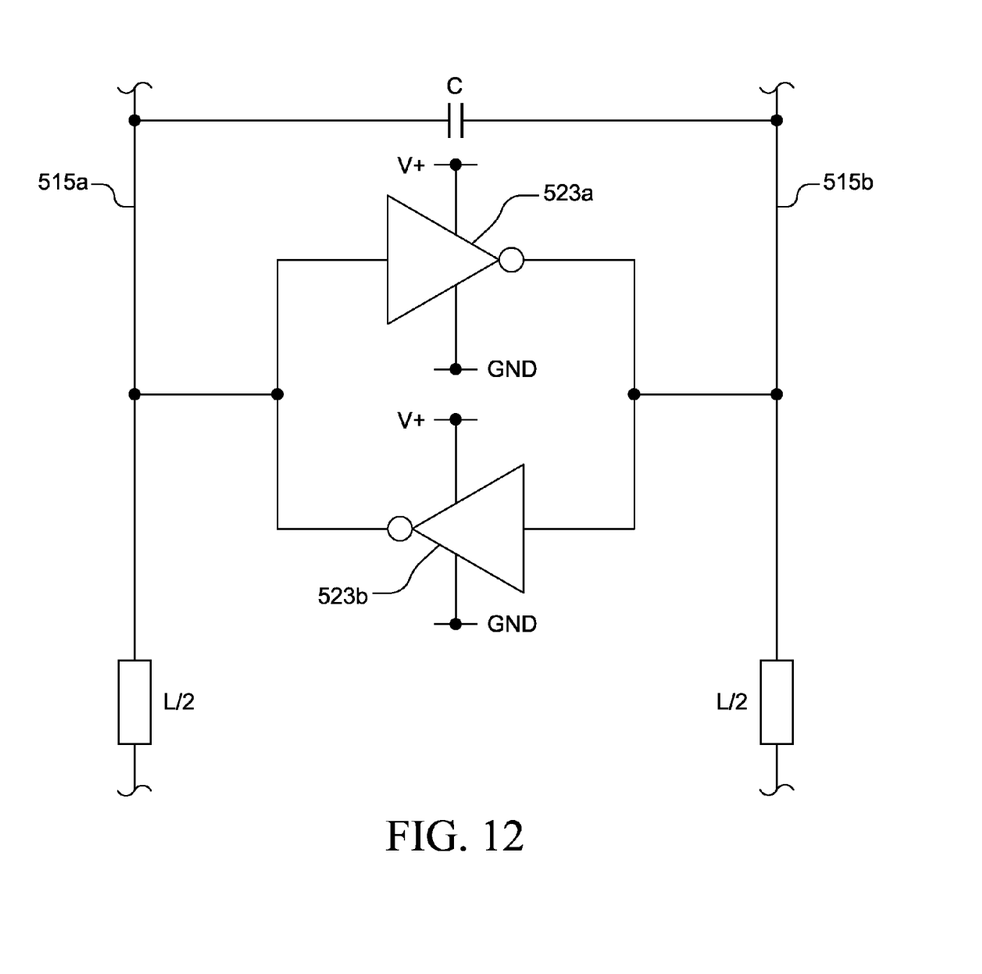
FIG. 12 shows a pair of back-to-back inverters connected across part of a transmission-line.
Figure 13A:
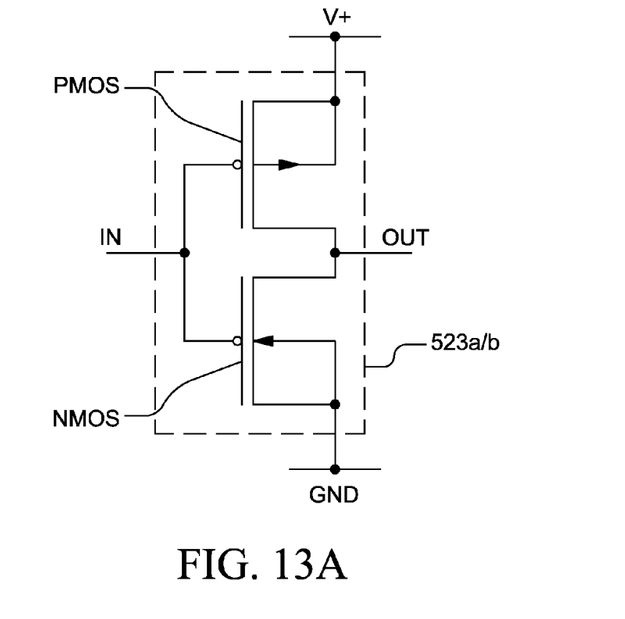
FIGS. 13a and 13b are outline and equivalent circuit diagrams of CMOS back-to-back inverters.
Figure 13B:
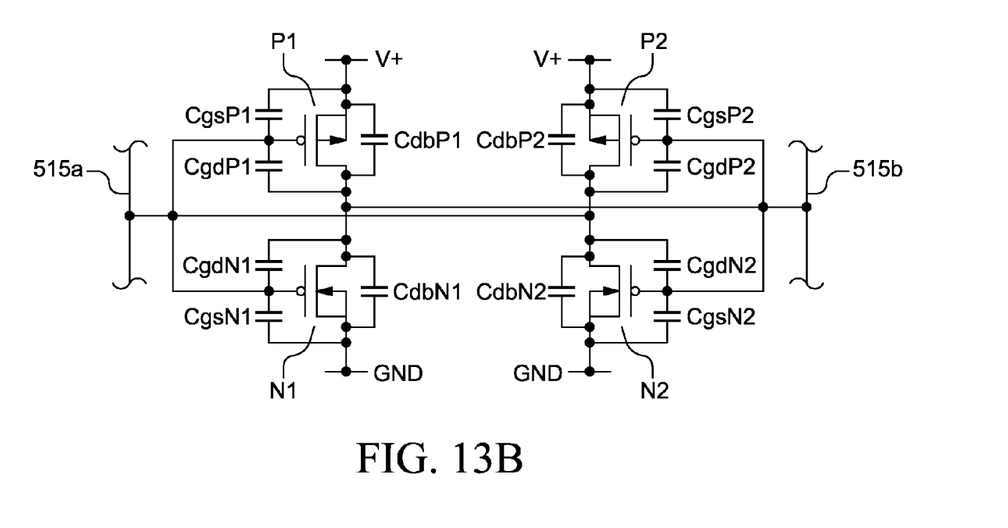

FIG. 12 shows a pair of back-to-back inverters 523a, 523b with supply line connectors and indications of distributed inductive (L/2) and capacitive (C) elements of a transmission-line as per FIG. 11b. FIG. 13a shows N-channel and P-channel Mosfet implementation of the back-to-back inverters 523a and 523b, see out of NMOS and PMOS transistors. FIG. 13b shows an equivalent circuit diagram for NMOS (N1, N2) and PMOS (P1, P2) transistors, together with their parasitic capacitances. The gate terminals of transistors P1 and N1 are connected to the conductive trace 515a and to the drain terminals of transistors P2 and N2. Similarly, the gate terminals of transistors P2 and N2 are connected to the conductive trace 515b and to the drain terminals of transistors P2 and N2. The PMOS gate-source capacitances CgsP1 and CgsP2, the PMOS gate-drain capacitances CgdP1 and CgdP2, and the PMOS drain-source and substrate capacitances CdbP1 and CdbP2, also the NMOS gate-source capacitances CgsN1 and CgsN2, the NMOS gate-drain capacitances CgdN1 and CgdN2, and the NMOS drain-source and substrate capacitances CdbN1 and CdbN2 are effectively absorbed into the characteristic impedance Zo of the transmission-line, so have much less effect upon transit times of the individual NMOS and PMOS transistors. The rise and fall times of the waveforms Φ1 and Φ2 are thus much faster than for prior circuits.

Although the present invention has been described in considerable detail with reference to certain preferred versions thereof, other versions are possible. Therefore, the spirit and scope of the appended claims should not be limited to the description of the preferred versions contained herein.

What is claimed is:

1. A sampling circuit comprising:
  a buffer having an input for receiving an input signal to be sampled, the buffer driving at its output a buffered version of the input signal;
  a holding capacitor for holding a voltage representative of a sampled, buffered input signal, the holding capacitor having first and second nodes;
  first, second and third switches, the first switch being connected between the buffer output and the first node of the holding capacitor, the first node of the holding capacitor for providing the sampled output voltage, and the second switch being connected between the second node of the holding capacitor and a first reference voltage, and the third switch being connected between the second node of the holding capacitor and a second reference voltage;

a multi-phase oscillator for providing one or more clock signals, one of which operates the second switch;

a control circuit that receives the one or more rotary clock signals and provides timing pulses for opening and closing the first switch and third switches, wherein the first switch and second switch are closed during sampling of the input signal and the second switch is opened to end the sampling, and wherein, after the second switch is opened, the control circuit closes the third switch to bias the voltage on the charging capacitor with the second reference voltage; and a fourth switch connected between the second node of the holding capacitor and the first reference voltage;

wherein, while the second switch is open and before the second switch is closed, the control circuit closes the fourth switch during an interval to cause the voltage on the second node of the holding capacitor to be substantially the same as the first reference voltage.

2. A sampling circuit as recited in claim 1,
wherein the multi-phase oscillator is a double feedback rotary traveling wave oscillator; and
wherein the second switch is closed with little or no effect on the oscillator.

3. A sampling circuit as recited in claim 1,
wherein the multi-phase oscillator is a double feedback rotary traveling wave oscillator; and
wherein the second switch is closed and opened by the oscillator at a time when there is zero or nearly zero volts across the second switch.

4. A sampling circuit as recited in claim 1, wherein the multi-phase oscillator includes:
one or more transmission line segments, each segment having ends and a length of spaced apart first and second conductors therebetween, each length of conductor being electrically continuous;
an odd number of passive connection means coupling the ends of the one or more segments to form a closed loop of the one or more segments and the passive connection means; and
a plurality of regeneration devices located at various spaced-apart positions on the loop and connected between the first and second conductors of a segment, wherein the regeneration devices are operative to establish and maintain a wave traveling around the loop, the traveling wave including a voltage wave between the first and second conductors,
wherein a single lap of the wave around the loop defines a propagation time, and
wherein each of the passive connection means causes the voltage of the traveling wave between the first and second conductors to reverse polarity, so that, at any location on a segment, there is a pair of oppositely phased oscillations having a period equal to twice the propagation time.

5. A sampling circuit as recited in claim 4, further comprising means for inducing the wave to travel around the loop in a preferred direction.

6. A sampling circuit as recited in claim 5, wherein the inducing means includes a mechanism for sequentially applying power to each of the regeneration devices in the preferred direction around the loop.

7. A sampling circuit as recited in claim 5, wherein the inducing means includes a mechanism for absorbing energy in the loop in a direction opposite to the preferred direction.

8. A sampling circuit as recited in claim 5, wherein the inducing means includes an intrinsic delay of the traveling wave on one or more transmission line segments applied to one or more of the regeneration devices.

9. A sampling circuit as recited in claim 8,
wherein at least one of the regeneration devices is a pair of back-to-back CMOS inverters, each inverter having a gate connected to one of the conductors, a drain connected to the other one of the conductors and a source connected to a supply voltage; and
wherein the delay of the traveling wave is applied between the gates and drains of each of the CMOS inverters.

10. A method of sampling an analog signal, the method comprising:
connecting a first node of a holding capacitor to a first reference voltage by means of a first switch;
connecting a second node of a holding capacitor to the analog signal by means of a second switch;
accumulating charge on a second node of the holding capacitor during a prescribed interval of time while the analog signal is connected to the holding capacitor;
disconnecting the first node of the holding capacitor from the first reference voltage to end the accumulation of charge;
disconnecting the second node of the holding capacitor from the analog signal;
connecting the first node of the holding capacitor to a second reference voltage by means of a third switch, the sampled analog signal being available on the second node of the holding capacitor; and
connecting and disconnecting the first node of the holding capacitor to the first reference voltage by means of a fourth switch prior to connecting the first node of the holding capacitor to the first reference voltage by means of the first switch.

11. A method of sampling an analog signal as recited in claim 10, wherein the step of connecting the first node to a first reference voltage occurs when there is zero volts or nearly zero volts between the first node of the holding capacitor and the first reference voltage.

12. A method of sampling an analog signal as recited in claim 10,
wherein the first switch is controlled by a signal from a multi-phase oscillator; and
wherein the connection of the first node to the first reference voltage has little or no effect on the oscillator.

13. A method of sampling an analog signal as recited in claim 10,
wherein the first switch is controlled by a signal from a double feedback rotary traveling wave oscillator; and
wherein the connection of the first node to the first reference voltage has little or no effect on the oscillator.

14. A method of sampling an analog signal as recited in claim 10, wherein the first reference voltage is a ground voltage.

15. A method of sampling an analog signal as recited in claim 10, wherein the second reference voltage is a supply voltage.

* * * * *